US012727220B2

(12) United States Patent
Kwon et al.

(10) Patent No.: US 12,727,220 B2
(45) Date of Patent: Sep. 1, 2026

(54) SEMICONDUCTOR DEVICE COMPRISING TWO-DIMENSIONAL MATERIAL AND METHOD OF MANUFACTURING THE SEMICONDUCTOR DEVICE

(71) Applicants: Samsung Electronics Co., Ltd., Suwon-si (KR); RESEARCH & BUSINESS FOUNDATION SUNGKYUNKWAN UNIVERSITY, Suwon-si (KR)

(72) Inventors: Junyoung Kwon, Suwon-si (KR); Sangwoo Kim, Yongin-si (KR); Kyung-Eun Byun, Suwon-si (KR); Minsu Seol, Suwon-si (KR); Minseok Shin, Suwon-si (KR); Pin Zhao, Suwon-si (KR); Taehyeong Kim, Suwon-si (KR); Jaehwan Jung, Suwon-si (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 564 days.

(21) Appl. No.: 18/154,978

(22) Filed: Jan. 16, 2023

(65) Prior Publication Data

US 2023/0275128 A1 Aug. 31, 2023

(30) Foreign Application Priority Data

Feb. 28, 2022 (KR) ........................ 10-2022-0026219

(51) Int. Cl.
*H10D 62/84* (2025.01)
*H10D 99/00* (2025.01)

(52) U.S. Cl.
CPC ............. *H10D 62/84* (2025.01); *H10D 99/00* (2025.01)

(58) Field of Classification Search
CPC .... H10D 30/481; H10D 30/47; H10D 30/485; H10D 62/84; H10D 99/00; H10D 8/00;
(Continued)

(56) References Cited

U.S. PATENT DOCUMENTS 7,968,674 B2 6/2011 Choi et al.
7,988,941 B2 8/2011 Choi et al.
(Continued)

FOREIGN PATENT DOCUMENTS

KR 10-1044369 B1 6/2011
KR 2016/0120057 A 10/2016
(Continued)

OTHER PUBLICATIONS

Mahmut Tosun et al., "Air-stable n-doping of WSe2 by anion vacancy formation with mild plasma treatment," ACS Nano 2016, 10, 7, 6853-6860.
(Continued)

*Primary Examiner* — Moazzam Hossain
(74) *Attorney, Agent, or Firm* — Harness, Dickey & Pierce, P.L.C.

(57) ABSTRACT

A semiconductor device including a two-dimensional material and a method of manufacturing the same are provided. The semiconductor device may include a first two-dimensional material layer including a first two-dimensional semiconductor material; a plurality of second two-dimensional material layers connected to the first two-dimensional material layer, each having a thickness greater than that of the first two-dimensional material layer, and including a doped
(Continued)

two-dimensional semiconductor material; and a plurality of electrodes on the plurality of second two-dimensional material layers.

11 Claims, 28 Drawing Sheets

(58) Field of Classification Search
CPC .... H10D 62/80; H10D 62/117; H10D 62/128; H10D 62/129; H10D 62/151; H10D 8/411; H10D 30/015
See application file for complete search history.

(56) References Cited

U.S. PATENT DOCUMENTS

| | | | |
|---|---|---|---|
| 8,133,466 | B2 | 3/2012 | Shin et al. |
| 8,283,038 | B2 | 10/2012 | Choi et al. |
| 8,535,553 | B2 | 9/2013 | Kong et al. |
| 8,623,761 | B2 | 1/2014 | Bonilla et al. |
| 8,723,024 | B2 | 5/2014 | Choi et al. |
| 8,895,433 | B2 | 11/2014 | Bonilla et al. |
| 8,906,787 | B2 | 12/2014 | Park et al. |
| 8,912,530 | B2 | 12/2014 | Yang et al. |
| 9,040,957 | B2 | 5/2015 | Lee et al. |
| 9,056,424 | B2 | 6/2015 | Wenxu et al. |
| 9,064,777 | B2 | 6/2015 | Heo et al. |
| 9,108,848 | B2 | 8/2015 | Woo et al. |
| 9,324,634 | B2 | 4/2016 | Bao et al. |
| 9,324,635 | B2 | 4/2016 | Bao et al. |
| 9,359,211 | B2 | 6/2016 | Woo et al. |
| 9,472,450 | B2 | 10/2016 | Bonilla et al. |
| 9,527,043 | B2 | 12/2016 | Choi et al. |
| 9,533,265 | B2 | 1/2017 | Choi et al. |
| 9,583,358 | B2 | 2/2017 | Kim et al. |
| 9,721,734 | B2 | 8/2017 | Ryu et al. |
| 10,269,975 | B2 | 4/2019 | Park et al. |
| 10,325,987 | B2 | 6/2019 | Park et al. |
| 10,741,646 | B2 | 8/2020 | Yeh et al. |
| 2010/0032290 | A1 | 2/2010 | Kikuchi et al. |
| 2011/0127471 | A1 | 6/2011 | Shin et al. |
| 2013/0059155 | A1 | 3/2013 | Choi et al. |
| 2014/0087191 | A1 | 3/2014 | Chua et al. |
| 2015/0235959 | A1 | 8/2015 | Lee et al. |
| 2016/0300958 | A1 | 10/2016 | Park et al. |
| 2019/0378715 | A1* | 12/2019 | Lin .................. H01L 21/02485 |
| 2020/0144405 | A1 | 5/2020 | Yun et al. |
| 2021/0057558 | A1* | 2/2021 | Pritchard ............ H10D 62/151 |
| 2021/0074543 | A1 | 3/2021 | Kim et al. |
| 2021/0305378 | A1 | 9/2021 | Seol et al. |
| 2022/0059683 | A1* | 2/2022 | Tateno ................ H10D 48/362 |
| 2022/0059702 | A1 | 2/2022 | Naylor et al. |
| 2022/0115541 | A1* | 4/2022 | Li ..................... H10D 30/6757 |
| 2025/0040209 | A1* | 1/2025 | Su ....................... H10D 30/481 |

FOREIGN PATENT DOCUMENTS

| | | | |
|---|---|---|---|
| KR | 10-1922771 | B1 | 11/2018 |
| KR | 10-2019-0119451 | A | 10/2019 |
| KR | 10-2020-0050380 | A | 5/2020 |
| KR | 10-2021-0030775 | A | 3/2021 |
| WO | 2018/009931 | A1 | 1/2018 |

OTHER PUBLICATIONS

Junyoung Kwon et al., "Thickness-dependent Schottky barrier height of MoS2 field-effect transistors," Nanoscale, Issue 18, 2017.

Pavel Bolshakov et al., "Contact Engineering for Dual-Gate MoS2 Transistors Using O2 Plasma Exposure," ACS Applied Electronic Materials, 2019, 1, 210-219.

Z. P. Ling, R. Yang et al., "Large-scale two-dimensional MoS2 photodetectors by magnetron sputtering," Optics Express vol. 23, Issue 10, pp. 13580-13586 (2015).

Lenan Zhang et al., "Thermal Expansion Coefficient of Monolayer Molybdenum Disulfide Using Micro-Raman Spectroscopy", Nano Lett., 19(7), 4745-4751. (2019).

Korean Offce Action dated Aug. 10, 2025 for corresponding Korean Patent Application No. 10-2022-0026219 and its English-language translation.

Korean Office Action dated Jun. 25, 2026 issued in corresponding Korean Patent Appln. No. 10-2022-0026219 (with English translation).

* cited by examiner

SEMICONDUCTOR DEVICE COMPRISING TWO-DIMENSIONAL MATERIAL AND METHOD OF MANUFACTURING THE SEMICONDUCTOR DEVICE

CROSS-REFERENCE TO RELATED APPLICATION

This application is based on and claims priority under 35 U.S.C. § 119 to Korean Patent Application No. 10-2022-0026219, filed on Feb. 28, 2022 in the Korean Intellectual Property Office, the disclosure of which is incorporated by reference herein in its entirety.

BACKGROUND

1. Field

The present disclosure relates to a semiconductor device including a two-dimensional material and/or a method of manufacturing the same.

2. Description of the Related Art

As miniaturization is progressing to improve the degree of integration of semiconductor devices, research using a two-dimensional material has recently been conducted for this purpose. A two-dimensional material refers to a crystalline material of within a few layers of atoms and is being studied as a substitute for silicon. Furthermore, two-dimensional materials have stable and excellent characteristics even with nano-scale thicknesses, and thus have been spotlighted as a next-generation material capable of overcoming performance degradation due to the miniaturization of semiconductor devices.

SUMMARY

Provided are a semiconductor device including a two-dimensional material and/or a manufacturing method thereof.

Additional aspects will be set forth in part in the description which follows and, in part, will be apparent from the description, or may be learned by practice of the presented embodiments of the disclosure.

According to an example embodiment, a semiconductor device may include a first two-dimensional material layer including a two-dimensional semiconductor material; a plurality of second two-dimensional material layers connected to the first two-dimensional material layer, each of the plurality of second two-dimensional material layers having a thickness greater than a thickness of the first two-dimensional material layer, and each of the plurality of second two-dimensional material layers including a doped two-dimensional semiconductor material; and a plurality of electrodes on the plurality of second two-dimensional material layers.

In some embodiments, each of the first two-dimensional material layer and the plurality of second two-dimensional material layers may include a transition metal dichalcogenide (TMD).

In some embodiments, the TMD may include at least one of Mo, W, Nb, V, Ta, Ti, Zr, Hf, Tc, Re, Cu, Ga, In, Sn, Ge, and Pb, and the TMD may include at least of S, Se, and Te.

In some embodiments, the first two-dimensional material layer may include one to three layers.

In some embodiments, the plurality of second two-dimensional material layers may include four layers or more.

In some embodiments, the plurality of second two-dimensional material layers may include four to ten layers.

In some embodiments, the plurality of second two-dimensional material layers may include a transition metal as a dopant.

In some embodiments, the first two-dimensional material layer may be between two adjacent second two-dimensional material layers among the plurality of second two-dimensional material layers.

According to an example embodiment, a method of manufacturing a semiconductor device may include preparing a first two-dimensional material layer including a two-dimensional semiconductor material on a substrate; forming a plurality of second two-dimensional material layers on a portion of the first two-dimensional material layer, the plurality of second two-dimensional material layers having a thickness greater than a thickness of the first two-dimensional material layer, and the plurality of second two-dimensional material layers including a doped two-dimensional semiconductor material; and forming a plurality of electrodes on the plurality of second two-dimensional material layers.

In some embodiments, the forming the plurality of second two-dimensional material layers may include removing a portion of the first two-dimensional material layer to expose the substrate to provide an exposed portion of the substrate; and forming the plurality of second two-dimensional material layers on the exposed portion of the substrate.

In some embodiments, the removing the portion of the first two-dimensional material layer may include preparing a patterned mask on the first two-dimensional material layer; and etching the portion of the first two-dimensional material layer exposed through the mask to remove the portion of the first two-dimensional material layer.

In some embodiments, the method may further include annealing the first two-dimensional material layer.

In some embodiments, the annealing may be performed at a temperature in a range of greater than or equal to 300° C. and less than or equal to 900° C.

In some embodiments, each of the first two-dimensional material layer and the plurality of second two-dimensional material layers may include a transition metal dichalcogenide (TMD).

In some embodiments, the first two-dimensional material layer may include one to three layers.

In some embodiments, the plurality of second two-dimensional material layers each may include four layers or more.

In some embodiments, the plurality of second two-dimensional material layers may be formed spaced apart from each other on the portion of the first two-dimensional material layer, and a region of the first two-dimensional material layer may be between two adjacent second two-dimensional material layers among the plurality of second two-dimensional material layers.

According to an example embodiment, a semiconductor device may include a first two-dimensional material layer including a first doped semiconductor material; and a plurality of second two-dimensional material layers connected to the first two-dimensional material layer, each of the plurality of second two-dimensional material layers having a thickness greater than a thickness of the first two-dimensional material layer, and the plurality of second two-dimensional material layers including a second doped semiconductor material.

In some embodiments, the first doped semiconductor material may include an n-type dopant, and the second doped semiconductor material may include a p-type dopant.

In some embodiments, the first doped semiconductor material may include a p-type dopant, and the second doped semiconductor material may include an n-type dopant.

In some embodiments, the first two-dimensional material layer including the first doped semiconductor material may include one layer.

In some embodiments, the plurality of second two-dimensional material layers including the second doped semiconductor material each may include three layers or more.

In some embodiments, the second two-dimensional material layer including the second doped semiconductor material may include three to ten layers.

In some embodiments, each of the first two-dimensional material layer and the second two-dimensional material layer may include a TMD.

In some embodiments, each of the first two-dimensional material layer and the plurality of the second two-dimensional material layers may include a transition metal dichalcogenide (TMD).

In some embodiments, the first two-dimensional material layer may be between two adjacent second two-dimensional material layers among the plurality of second two-dimensional material layers, and the plurality of second two-dimensional material layers may include a transition metal dopant, an n-type dopant, or a p-type dopant.

According to an example embodiment, a method of manufacturing a semiconductor device may include preparing a first two-dimensional material layer on a substrate, the first two-dimensional material layer including a first doped semiconductor material; and forming a plurality of second two-dimensional material layers connected to the first two-dimensional material layer, each of the plurality of second two-dimensional material layers having a thickness greater than a thickness of the first two-dimensional material layer, and the plurality of second two-dimensional material layers including a second doped semiconductor material.

In some embodiments, the forming the plurality of second two-dimensional material layers may include removing a portion of the first two-dimensional material layer to expose the substrate and provide an exposed region of the substrate; and forming the plurality of second two-dimensional material layers on the exposed region of the substrate.

In some embodiments, the removing the portion of the first two-dimensional material layer may include preparing a patterned mask on the first two-dimensional material layer, the patterned mask exposing the portion of the first two-dimensional material layer; and etching and removing the portion of the first two-dimensional material layer exposed through the mask.

In some embodiments, the method may further include annealing the first two-dimensional material layer.

In some embodiments, the first two-dimensional material layer including the first doped semiconductor material may include one layer.

In some embodiments, the plurality of second two-dimensional material layers including the second doped semiconductor material each may include three layers or more.

In some embodiments, each of the first two-dimensional material layer and the plurality of second two-dimensional material layers may include a transition metal dichalcogenide (TMD).

In some embodiments, the forming the plurality of second two-dimensional material layers connected to two-dimensional material layer may include forming the second two-dimensional material layers spaced apart from each other and arranged so the first two-dimensional material layer is between the plurality of second two-dimensional material layers. The plurality of second two-dimensional material layers may include a transition metal dopant, an n-type dopant, or a p-type dopant.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
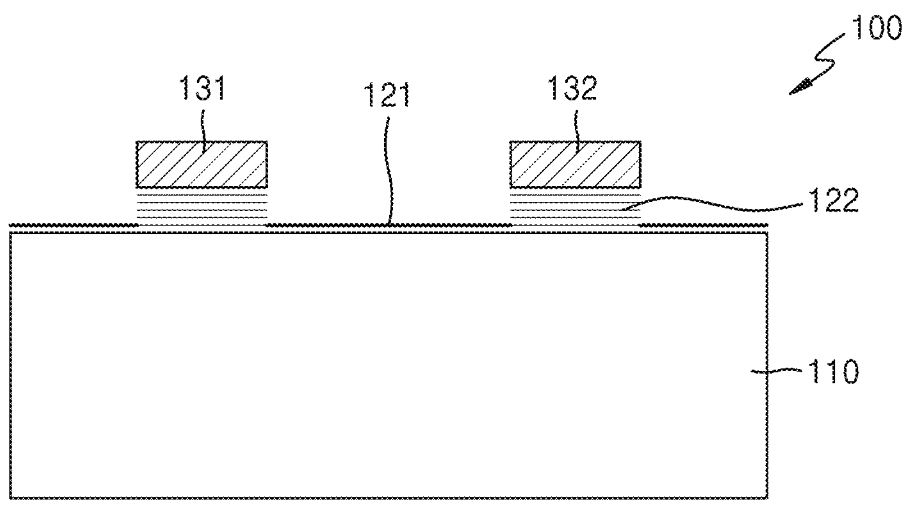
FIG. 1 illustrates a semiconductor device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

Hereinafter, example embodiments will be described in detail with reference to the accompanying drawings. In the following drawings, the same reference numerals refer to the same components, and the size of each component in the drawings may be exaggerated for clarity and convenience of description. Meanwhile, the embodiments described below are merely examples and various modifications are possible from these embodiments.

Hereinafter, the term “upper portion” or “on” may also include “to be present on a non-contact basis” as well as “to be in directly contact with”. The singular expression includes plural expressions unless the context clearly implies otherwise. In addition, when a part “includes” a component, this means that it may further include other components, not excluding other components unless otherwise opposed.

The use of the term “the” and similar indicative terms may correspond to both singular and plural. If there is no explicit description of an order for steps that make up a method or vice versa, these steps can be done in an appropriate order and are not necessarily limited to the order described.

Further, the terms “unit”, “module” or the like mean a unit that processes at least one function or operation, which may be implemented in hardware or software or implemented in a combination of hardware and software.

The connection or connection members of lines between the components shown in the drawings exemplarily represent functional connection and/or physical or circuit connections, and may be replaceable or represented as various additional functional connections, physical connections, or circuit connections in an actual device.

The use of all examples and terms is simply to describe technical ideas in detail, and the scope is not limited by these examples and terms unless the scope is limited by the claims.

FIG. 1 illustrates a semiconductor device 100 according to an example embodiment. The semiconductor device 100 shown in FIG. 1 may be, for example, a field effect transistor (FET).

Referring to FIG. 1, the substrate 110 is provided such that a first two-dimensional material layer 121 and a plurality of second two-dimensional material layers 122 are connected to each other, and a plurality of electrodes 131 and 132 are provided in a plurality of second two-dimensional material layers 122.

The first two-dimensional material layer 121 may include a two-dimensional semiconductor material. Here, the two-dimensional semiconductor material has a crystal structure in which the constituent atoms are two-dimensionally bonded, and means a material having semiconductor characteristics.

For example, the first two-dimensional material layer 121 may include transition metal dichalcogenide (TMD). TMD is a compound of transition metals and chalcogen elements. Here, the transition metal may include, for example, at least one selected from the group consisting of Mo, W, Nb, V, Ta, Ti, Zr, Hf, Tc, Re, Cu, Ga, In, Sn, Ge, and Pb, and the chalcogen element may include, for example, at least one selected from the group consisting of S, Se, and Te. For example, the first two-dimensional material layer may include $MoS_2$, $WS_2$, $MoSe_2$, or $WSe_2$. However, this is merely an example.

The first two-dimensional material layer 121 may have a layer number of one or more layers. For example, the first two-dimensional material layer 121 may include the layer number of one to three layers. However, embodiments are not limited thereto.

The second two-dimensional material layers 122 may be provided on the substrate 110 to be connected to the first two-dimensional material layer 121. The second two-dimensional material layer 122 may include a two-dimensional semiconductor material including a dopant. Like the first two-dimensional material layer 121, the second two-dimensional material layer 122 may include a TMD. Here, the TMD may include, for example, one metal element selected from the group consisting of Mo, W, Nb, V, Ta, Ti, Zr, Hf, Tc, Re, Cu, Ga, In, Sn, Ge, and Pb, and one chalcogen element selected from the group consisting of S, Se, and Te. The second two-dimensional material layer 122 may include the same two-dimensional semiconductor material as the first two-dimensional material layer 121. However, embodiments are not limited thereto, and the second two-dimensional material layer 122 may include a two-dimensional semiconductor material different from the first two-dimensional material layer 121.

The second two-dimensional material layer 122 may include a dopant. Here, the dopant may serve to reduce a resistance between the second two-dimensional material layer 122 and each of the electrodes provided thereon. The dopant included in the second two-dimensional material layer 122 may include, for example, a transition metal. The transition metal may include, for example, at least one of Nb, Re, Ta, Tc, Mn, and V. However, embodiments are not limited thereto.

The second two-dimensional material layer 122 may have a thick thickness to reduce contact resistance between the second two-dimensional material layer 122 and each of the electrodes provided thereon. Specifically, the second two-dimensional material layer 122 may have a thickness greater than that of the first two-dimensional material layer 121. That is, the second two-dimensional material layer 122 may include the layer number more than the layer number of the first two-dimensional material layer 121. For example, the second two-dimensional material layer 122 may include the layer number of four or more layers. For example, the second two-dimensional material layer 122 may include the layer number of 4 to 10 layers. However, embodiments are not limited thereto.

Each layer in the first two-dimensional layer 121 and the second two-dimensional layer 122 may correspond to one layer of atoms. A plurality of electrodes may be provided in the plurality of second two-dimensional material layers 122. The plurality of electrodes 131 and 132 may include, for example, a metal material such as Al or Cu, but are not limited thereto. The plurality of electrodes 131 and 132 may include, for example, a source electrode and a drain electrode. Here, the first two-dimensional material layer connecting the plurality of second two-dimensional material layers may serve as a channel layer.

Meanwhile, although not shown in the drawings, a gate electrode may be provided on the first two-dimensional material layer 121 connected to the plurality of second two-dimensional material layers 122, and a gate insulating layer may be provided between the gate electrode and the first two-dimensional material layer 121. The gate electrode (not shown) may be spaced apart from the electrodes 131 and 132 and the gate electrode (not shown) may be spaced apart from the plurality of second two-dimensional material layers 122.

In the semiconductor device according to the embodiment, the second two-dimensional material layer 122 includes a dopant and the second two-dimensional material layer 122 is thickly formed, thereby reducing contact resistance between the second two-dimensional material layer 122 and each of the electrodes provided on the second two-dimensional material layer 122.

The second two-dimensional material layer is doped to reduce the contact resistance between the second two-dimensional material layer 122 and each of the electrodes. Specifically, a Schottky barrier may be reduced by forming the doped second two-dimensional material layer in a region contacting the electrode, thereby reducing contact resistance between the second two-dimensional material layer and each of the electrodes. Meanwhile, contact resistance may be further reduced by forming the second two-dimensional material layer with doped $MoS_2$.

In addition, the thickness of the second two-dimensional material layer may be thicker than the thickness of the four or more layers, thereby further reducing the contact resistance between the second two-dimensional material layer and each of the electrodes provided on the second two-dimensional material layer. Specifically, as the thickness of the two-dimensional semiconductor material increases, the bandgap decreases. Therefore, the contact resistance between the second two-dimensional material layer and each of the electrodes may be reduced by reducing the contact barrier when the second two-dimensional material layer is thickly formed.

Hereinafter, a method of manufacturing the above-described semiconductor device 100 will be described. FIGS. 2A to 2F are views for explaining a method of manufacturing a semiconductor device 200 according to an example embodiment.

Figure 2A:
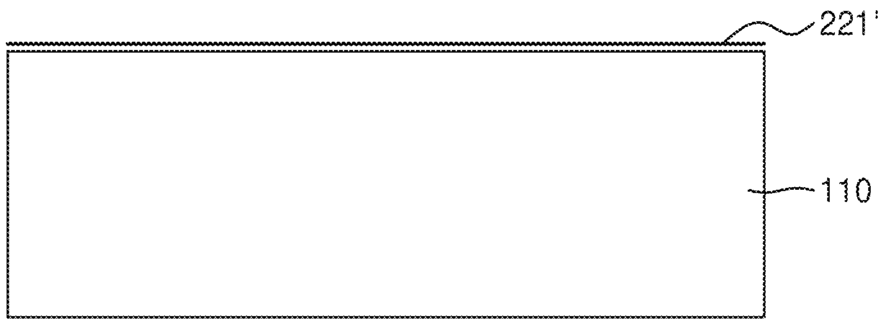
FIGS. 2A to 2F are views for explaining a method of manufacturing a semiconductor device according to an example embodiment.

Referring to FIG. 2A, a first two-dimensional material layer 221' is formed on a substrate. The substrate may include, for example, silicon, but this is only an example and may include various other materials. The first two-dimensional material layer 221 ' may be formed by depositing a two-dimensional semiconductor material on the substrate 110. Here, the deposition of the first two-dimensional material layer 221' may be performed through, for example, chemical vapor deposition (CVD) or physical vapor deposition (PVD). However, embodiments are not limited thereto.

The first two-dimensional material layer 221' may include a TMD. Here, the TMD may include, for example, one metal element selected from the group consisting of Mo, W, Nb, V, Ta, Ti, Zr, Hf, Tc, Re, Cu, Ga, In, Sn, Ge, and Pb, and one chalcogen element selected from the group consisting of S, Se, and Te. As an example, the first two-dimensional material layer may include $MoS_2$, $WS_2$, $MoSe_2$, or $WSe_2$ but is merely an example.

The first two-dimensional material layer 221' may have the layer number of one or more layers. For example, the first two-dimensional material layer 221' may include the layer number of one to three layers. However, embodiments are not limited thereto.

Figure 2B:
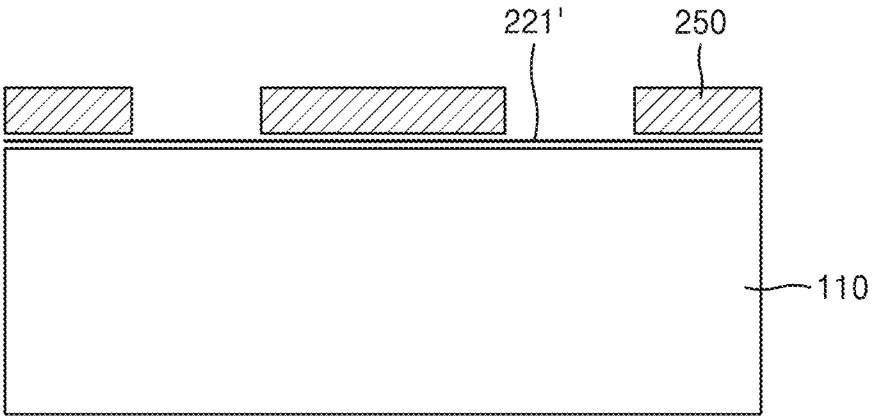

Referring to FIG. 2B, a mask 250 is formed on the first two-dimensional material layer 221'. Here, holes through which the first two-dimensional material layer 221' is partially exposed are formed in the mask 250. The mask 250 may include, for example, a photoresist. In this case, the mask 250 may be formed by forming a photoresist on the first two-dimensional material layer 221' and then patterning the photoresist.

The mask may include other mask materials in addition to the photoresist. In this case, the mask may be formed by sequentially forming a mask material and a photoresist on the first two-dimensional material layer, patterning the photoresist, and etching the mask material using the patterned photoresist as an etching mask.

Figure 2C:
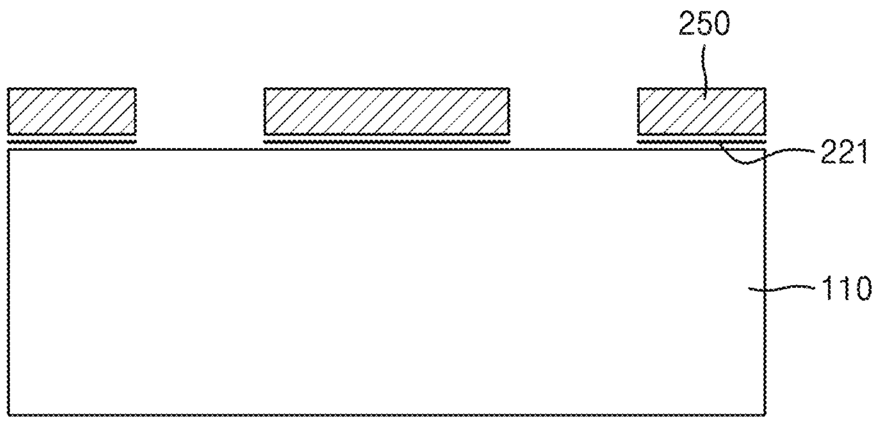

Referring to FIG. 2C, a portion of the first two-dimensional material layer 221' exposed through the holes of the mask 250 is etched and removed. Through this, a portion of the substrate may be removed to form a first two-dimensional material layer 221 exposing the substrate. Here, the etching of the first two-dimensional material layer 221' may be performed, for example, through sputtering etching. However, etching of the first two-dimensional material layer is not limited thereto, and may be performed through various other etching methods.

Figure 2D:
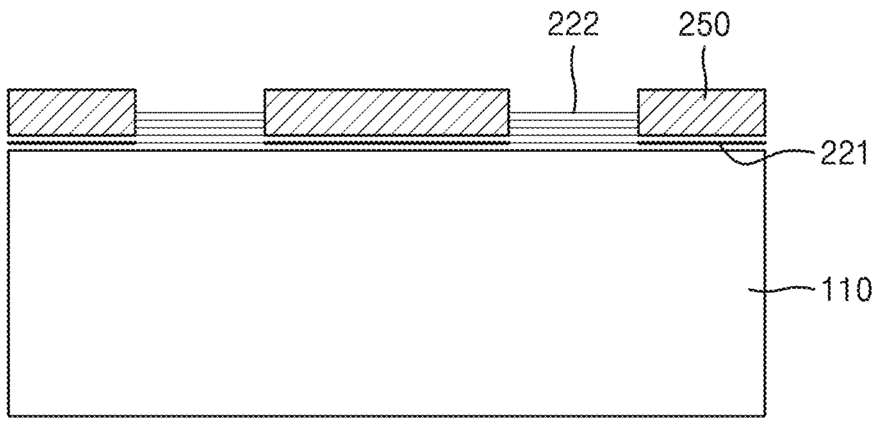

Referring to FIG. 2D, a plurality of second two-dimensional material layers 222 are formed on the surface of the substrate 110 exposed by the first two-dimensional material layer. Accordingly, the plurality of second two-dimensional material layers 222 connected to the first two-dimensional material layer 221 may be formed on the substrate.

The second two-dimensional material layers 222 may include a two-dimensional semiconductor material including a dopant. Like the first two-dimensional material layer 221, the second two-dimensional material layers 222 may include a TMD. Here, the TMD may include, for example, one metal element selected from the group consisting of Mo, W, Nb, V, Ta, Ti, Zr, Hf, Tc, Re, Cu, Ga, In, Sn, Ge, and Pb, and one chalcogen element selected from the group consisting of S, Se, and Te. The second two-dimensional material layers 222 may include the same two-dimensional semiconductor material as the first two-dimensional material layer 221. However, embodiments are not limited thereto, and the second two-dimensional material layers 122 may include a two-dimensional semiconductor material different from the first two-dimensional material layer 221.

The second two-dimensional material layers 222 may include a dopant. The dopant included in the second two-dimensional material layers 222 may include, for example, a transition metal. The transition metal may include, for example, at least one of Nb, Re, Ta, Tc, Mn, and V. However, embodiments are not limited thereto.

The second two-dimensional material layers 222 may have a thickness greater than that of the first two-dimensional material layer 221. That is, the second two-dimensional material layers 222 may include the layer number more than the layer number of the first two-dimensional material layer 221. For example, the second two-dimensional material layers 222 may include the layer number of four or more layers. More specifically, the second two-dimensional material layers 222 may include the layer number of 4 to 10 layers. However, embodiments are not limited thereto.

The formation of the doped second two-dimensional material layers may be carried out through, for example, physical vapor deposition (PVD) such as sputtering deposition, chemical vapor deposition (CVD), or the like. The sputtering process may grow a two-dimensional material at a relatively low temperature compared to chemical vapor deposition. Therefore, when the above-described mask includes a photoresist requiring a low temperature process, the doped second two-dimensional material layer may be formed through sputtering deposition.

Figure 2E:
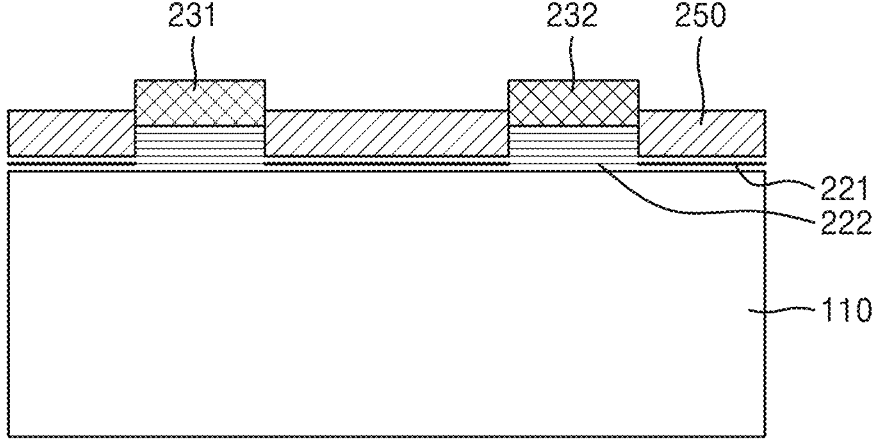

Referring to FIG. 2E, a plurality of electrodes 231 and 232 are formed on the plurality of second two-dimensional material layers 222. The plurality of electrodes 231 and 232 may be formed through a metallization process of depositing a metal material such as aluminum (Al) or copper (Cu) on the plurality of second two-dimensional material layers 222.

Figure 2F:
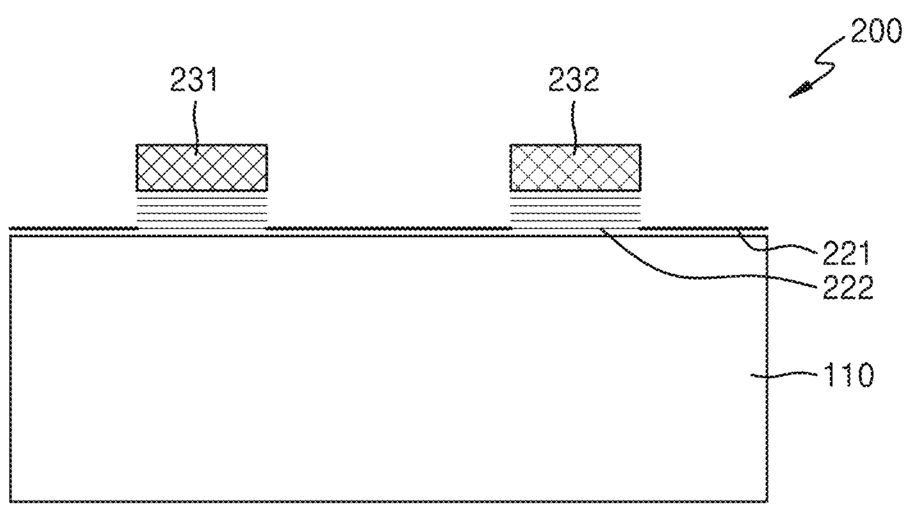

Referring to FIG. 2F, the patterned mask 250 formed on the first two-dimensional material layer 221 may be removed. Here, the mask 250 may be removed through an etching or lift-off process. However, embodiments are not limited thereto.

FIGS. 3A to 3F are views for explaining a method of manufacturing a semiconductor device 300 according to another example embodiment. Hereinafter, differences from the above-described embodiment will be mainly described.

Figure 3A:
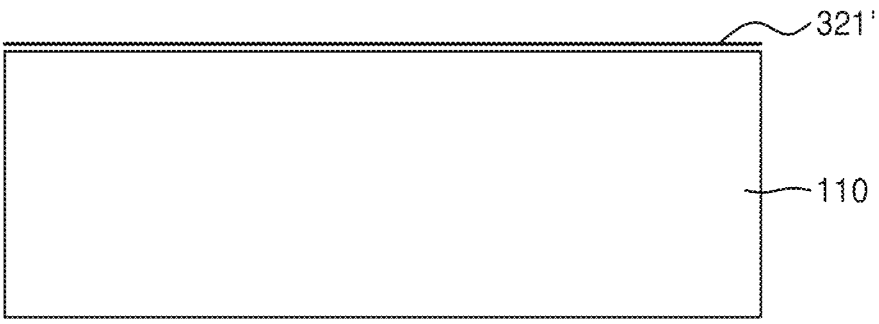
FIGS. 3A to 3F are views for explaining a method of manufacturing a semiconductor device according to another example embodiment.

Referring to FIG. 3A, a first two-dimensional material layer 321' is formed on a substrate. The first two-dimensional material layer 321' may be formed by, for example, chemical vapor deposition (CVD), physical vapor deposition (PVD), or the like. The first two-dimensional material layer 321' may include a TMD. The first two-dimensional material layer 321' may have the layer number of one or more layers. For example, the first two-dimensional material layer 321' may include the layer number of one to three layers.

Figure 3B:
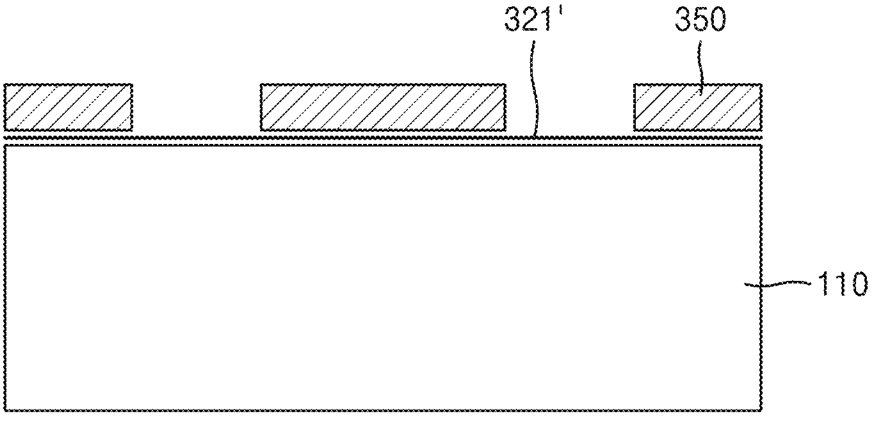

Referring to FIG. 3B, a mask 350 is formed on the first two-dimensional material layer 321'. Here, holes through which the first two-dimensional material layer 321' is partially exposed are formed in the mask 350. The mask 350 may include, for example, a photoresist or other material.

Figure 3C:
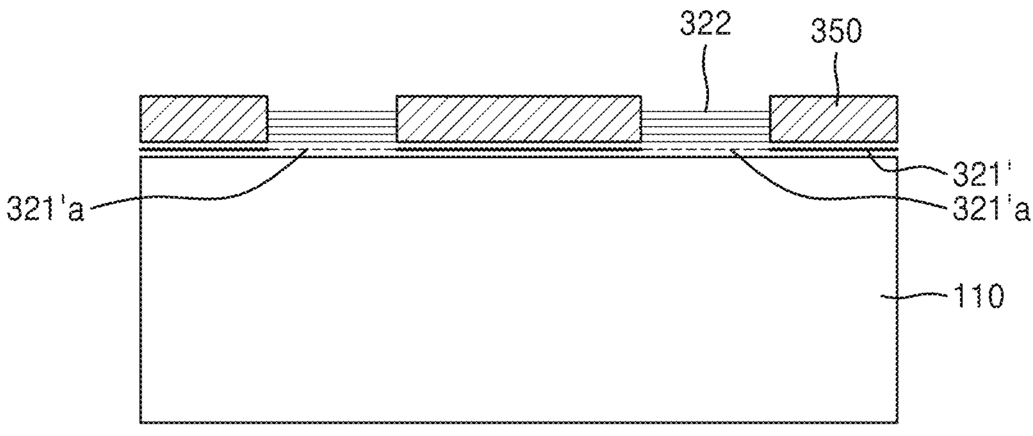

Referring to FIG. 3C, a plurality of second two-dimensional material layers 322 are deposited on the first two-dimensional material layer 321' exposed through the holes of the mask 350. Accordingly, the plurality of second two-dimensional material layers 322 connected to the first two-dimensional material layer 321' may be formed on the substrate.

The second two-dimensional material layers 322 may include a two-dimensional semiconductor material including a dopant. Like the first two-dimensional material layer 321, the second two-dimensional material layers 322 may include a TMD. The second two-dimensional material layers 322 may include a dopant. The dopant included in the second two-dimensional material layers 322 may include, for example, a transition metal. The transition metal may include, for example, at least one of Nb, Re, Ta, Tc, Mn, and V. However, embodiments are not limited thereto.

The second two-dimensional material layers 322 may have a thickness greater than that of the first two-dimensional material layer 321. That is, the second two-dimensional material layers 322 may include the layer number more than the layer number of the first two-dimensional material layer 321. For example, the second two-dimensional material layers 322 may include the layer number of four or more layers. More specifically, the second two-dimensional material layers 322 may include the layer number of 4 to 10 layers. However, embodiments are not limited thereto.

The formation of the doped second two-dimensional material layers 322 may be carried out through, for example, physical vapor deposition (PVD) such as sputtering deposition, chemical vapor deposition (CVD), or the like. However, this is merely an example. The sputtering process may grow a two-dimensional semiconductor material at a relatively low temperature compared to chemical vapor deposition. Therefore, when the above-described mask includes a photoresist requiring a low temperature process, the doped second two-dimensional material layer may be formed through sputtering deposition.

In the process of depositing the second two-dimensional material layer 322, a portion of the first two-dimensional material layer 321' under the second two-dimensional material layer may be damaged. For example, in the process of depositing the second two-dimensional material layer 322 through sputtering deposition, a damaged region 321'*a* including a crack may be generated on a portion of the first two-dimensional material layer. However, it is merely an example and a damage region may be generated even through other deposition processes. The damage region 321'*a* of the first two-dimensional material layer may cause quality degradation with respect to at least one of the plurality of second two-dimensional material layers deposited through a subsequent additional process.

Figure 3D:
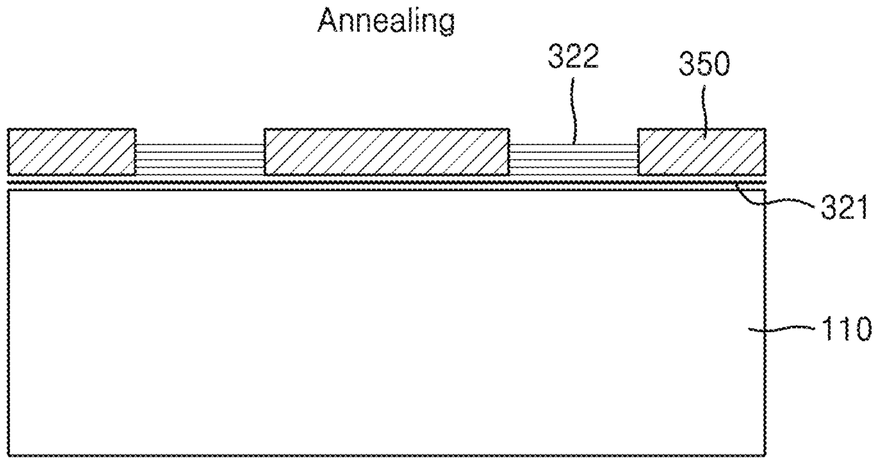

Referring to FIG. 3D, an annealing process is performed in the structure shown in FIG. 3C. Here, the annealing process may serve to treat the damaged region of the first two-dimensional material layer described above by heat-treating the damaged region at a desired and/or alternatively predetermined temperature. This annealing process may be performed, for example, at a temperature of about 300° C. or more and 900° C. or less. However, embodiments are not limited thereto.

Figure 4A:
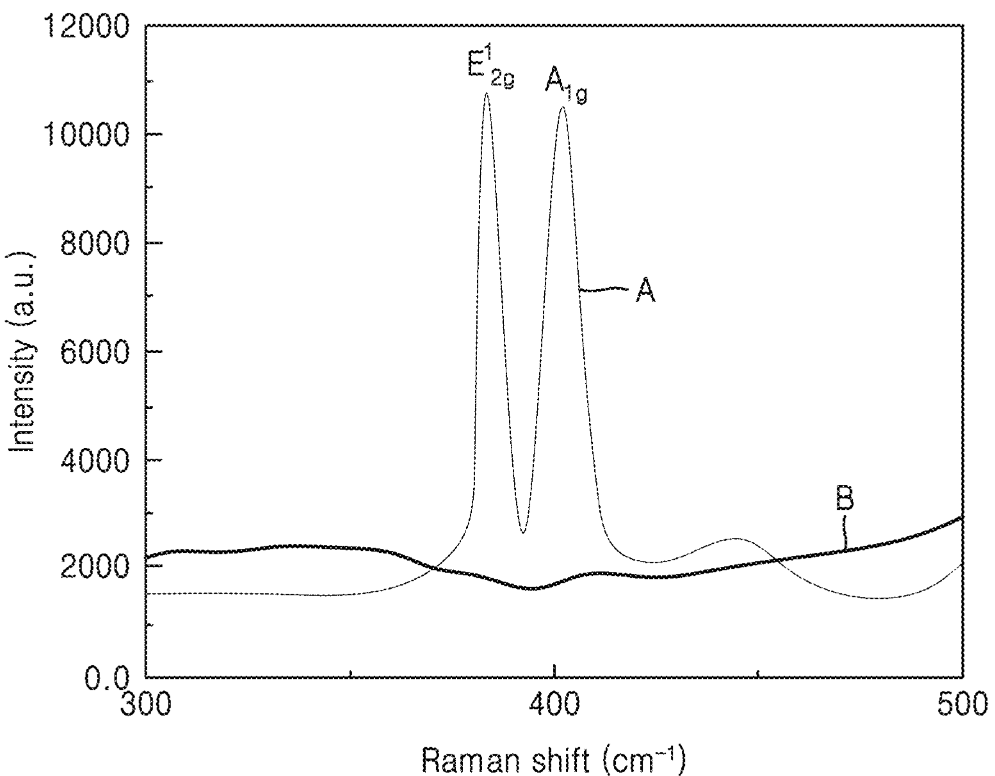
FIGS. 4A and 4B are Raman spectra showing a state in which a damaged region of a two-dimensional material layer is healed by an annealing process.
Figure 4B:
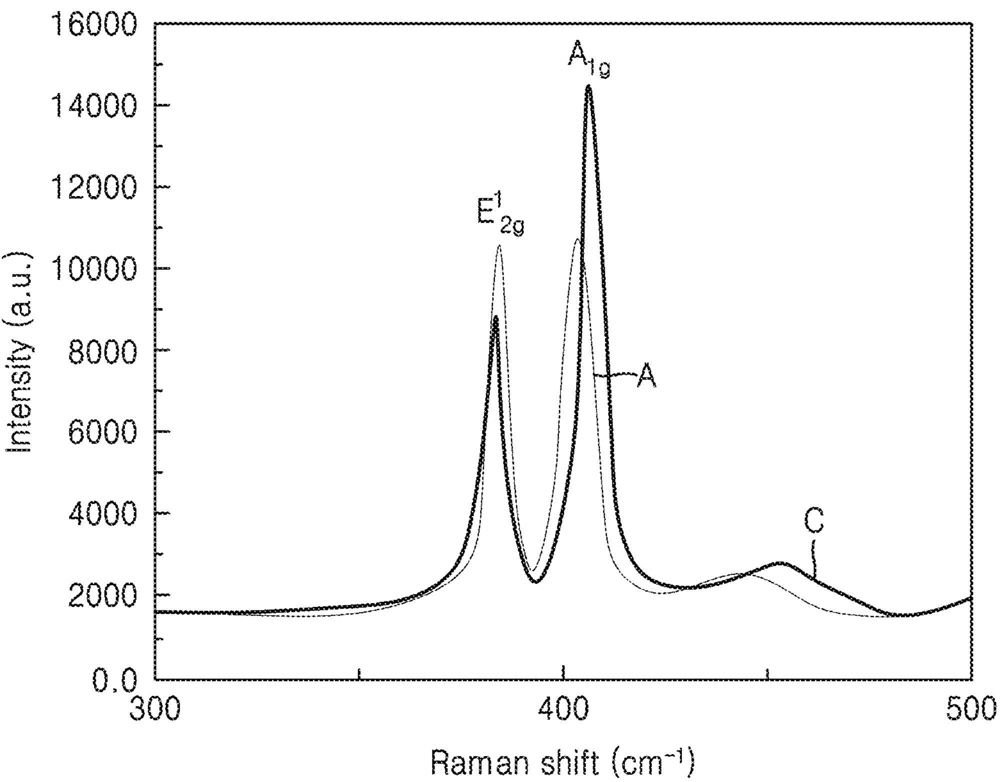

FIGS. 4A and 4B are Raman spectra showing a state in which a damaged region of a two-dimensional material layer was healed by an annealing process.

FIG. 4A illustrates a Raman spectrum of a first $MoS_2$ layer deposited by chemical vapor deposition (CVD) when the first $MoS_2$ layer is formed on the substrate by chemical vapor deposition (CVD) and then a second $MoS_2$ layer is formed thereon by sputtering deposition.

In FIG. 4A, "A" represents a Raman spectrum of the first $MoS_2$ layer measured before sputtering deposition is performed, and "B" represents a Raman spectrum of the first $MoS_2$ layer measured after sputtering deposition. Referring to FIG. 4A, it was confirmed that the Raman peak disappeared by the sputtering deposition, and from this, it can be seen that the first $MoS_2$ layer formed by the chemical vapor deposition (CVD) is damaged by the sputtering deposition.

FIG. 4B illustrates a Raman spectrum of a first $MoS_2$ layer deposited by chemical vapor deposition (CVD) when the first $MoS_2$ layer is formed on the substrate by chemical vapor deposition (CVD), a second $MoS_2$ layer is formed thereon by sputtering deposition, and then an annealing process is performed.

In FIG. 4B, "A" represents a Raman spectrum of the first $MoS_2$ layer measured before sputtering deposition is performed, and "C" represents a Raman spectrum of the first $MoS_2$ layer measured after annealing process. Referring to FIG. 4B, it was confirmed that the Raman peak was seen again through the annealing process, and from this, it can be seen that the damaged first $MoS_2$ layer was treated by the annealing process.

Figure 3E:
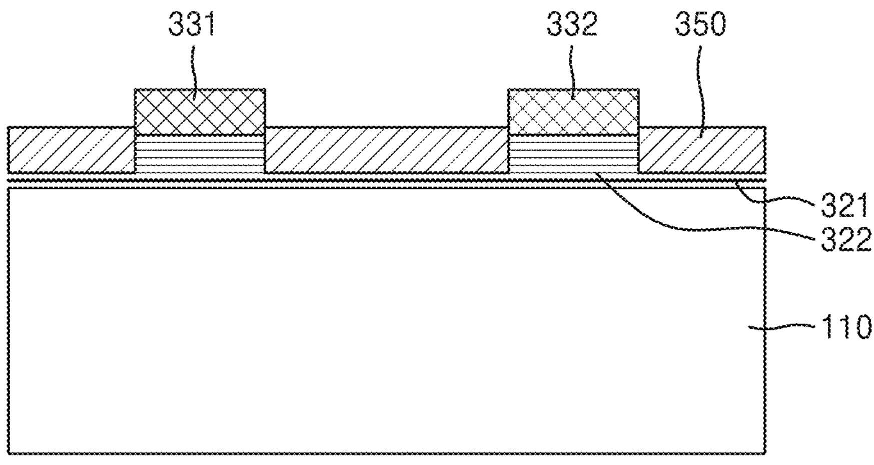

Referring to FIG. 3E, a plurality of electrodes 331 and 332 are formed on the plurality of second two-dimensional material layers 322. The plurality of electrodes 331 and 332 may be formed through a metallization process of depositing a metal material such as Al or Cu on the plurality of second two-dimensional material layers 322. However, the material for the electrode is not limited thereto.

Figure 3F:
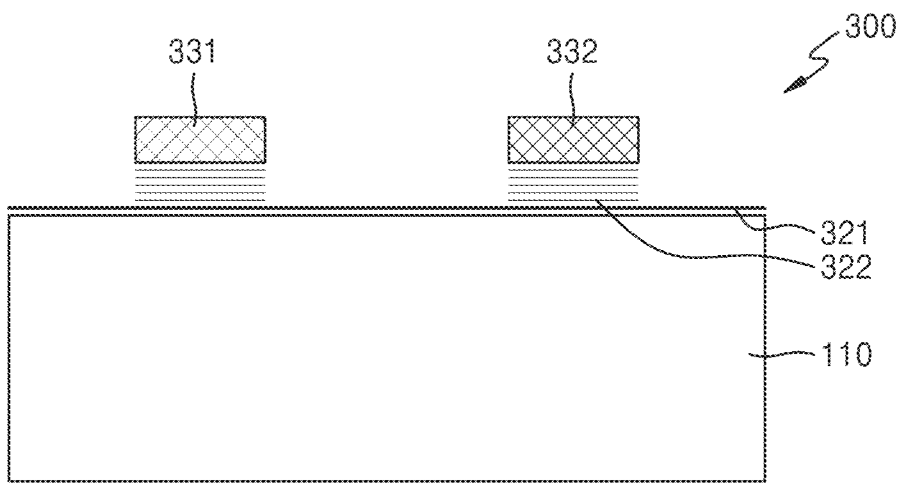

Referring to FIG. 3F, the mask 350 formed on the first two-dimensional material layer 321 may be removed. Here, the mask 350 may be removed through an etching or lift-off process. However, embodiments are not limited thereto.

In addition, according to the semiconductor device and the manufacturing method according to the present embodiment, sputtering deposition and metallization processes may be continuously performed through a single lithography process. However, the deposition process is not limited to sputtering, and may include CVD or PVD.

Figure 5:
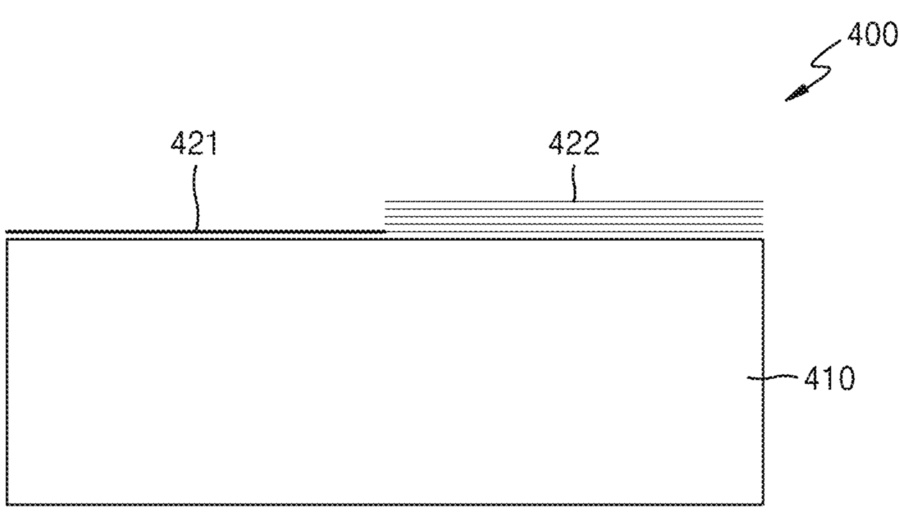
FIG. 5 illustrates a semiconductor device according to another example embodiment.

FIG. 5 illustrates a semiconductor device according to another example embodiment. The semiconductor device 400 shown in FIG. 5 may be, for example, a P-N junction diode. Hereinafter, differences from the above-described embodiment will be mainly described.

Referring to FIG. 5, a substrate 410 is provided such that a first two-dimensional material layer 421 and a second two-dimensional material layer 422 are connected to each other. Here, the first and second two-dimensional material layers may include a two-dimensional semiconductor material including dopants having opposite polarities. Here, as described above, the two-dimensional semiconductor material has a crystal structure in which the constituent atoms are two-dimensionally bonded, and means a material having semiconductor characteristics.

The two-dimensional semiconductor material may include, for example, a TMD. Here, the TMD may include, for example, one metal element selected from the group consisting of Mo, W, Nb, V, Ta, Ti, Zr, Hf, Tc, Re, Cu, Ga, In, Sn, Ge, and Pb, and one chalcogen element selected from the group consisting of S, Se, and Te. However, embodiments are not limited thereto. As an example, the first two-dimensional material layer 421 may include $MoS_2$, $WS_2$, $MoSe_2$, or $WSe_2$. However, this is merely an example.

The first two-dimensional material layer 421 may include a first doped two-dimensional semiconductor material. The first doped two-dimensional semiconductor material may include a dopant having a desired and/or alternatively predetermined polarity. In addition, the second two-dimensional material layer 422 may include a second doped two-dimensional semiconductor material. The second doped two-dimensional semiconductor material may include a dopant having a polarity opposite to that of the first doped two-dimensional semiconductor material.

For example, the first doped two-dimensional semiconductor material may include an n-type dopant, and the second doped two-dimensional semiconductor material may include a p-type dopant. For another example, the first doped two-dimensional semiconductor material may include a p-type dopant, and the second doped two-dimensional semiconductor material may include an n-type dopant. The p-type dopant may include, for example, at least one of B, Al, Ga, and In. The n-type dopant may include, for example, at least one of Ph, As, and Sb.

The first two-dimensional material layer 421 may have the layer number of one layer. However, embodiments are not necessarily limited thereto. The second two-dimensional material layers 422 may have a thickness greater than that of the first two-dimensional material layer 421. That is, the second two-dimensional material layer 422 may have the layer number of two or more layers. For example, the second two-dimensional material layer 422 may have the layer number of 3 or more layers and 10 or less layers. However, embodiments are not limited thereto.

In the semiconductor device according to the present embodiment, the first two-dimensional material layer 421 and the second two-dimensional material layer 422 which are provided to be connected to each other on the substrate may include a two-dimensional semiconductor material doped with dopants having opposite polarities, thereby forming a P-N junction. In addition, the first two-dimensional material layer 421 and the second two-dimensional material layer 422 may be bonded by lateral homojunction to form a P-N junction, and the number of layers of each of the first two-dimensional material layer 421 and the second two-dimensional material layer 422 may be easily controlled, to thereby easily control a band structure.

Hereinafter, a method of manufacturing the above-described semiconductor device 400 will be described. FIGS. 6A to 6E are views for explaining a method of manufacturing a semiconductor device according to an example embodiment.

Figure 6A:
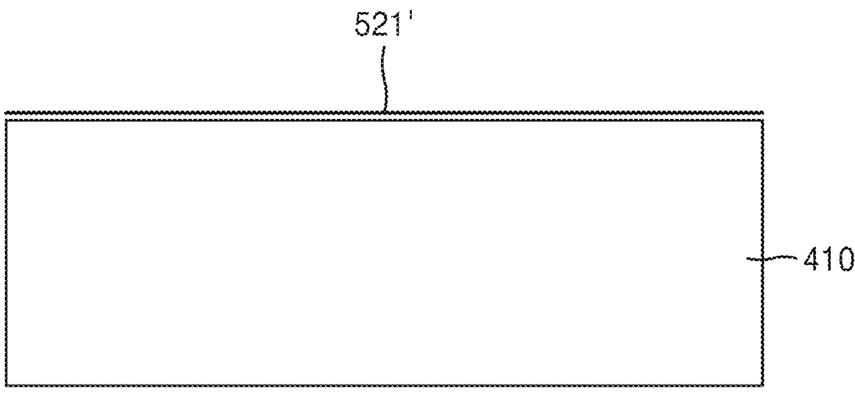
FIGS. 6A to 6E are views for explaining a method of manufacturing a semiconductor device according to another example embodiment.

Referring to FIG. 6A, a first two-dimensional material layer 521' is formed on a substrate 410. The substrate may include, for example, silicon, but this is only an example and the substrate alternatively may include various other materials. The first two-dimensional material layer 521' may be formed by depositing a first doped two-dimensional semiconductor material on the substrate 410. The first doped two-dimensional semiconductor material refers to a two-dimensional semiconductor material doped with a dopant having a desired and/or alternatively predetermined polarity, for example, an n-type dopant or a p-type dopant. Here, the two-dimensional semiconductor material may include a TMD.

The first two-dimensional material layer 521' may include a two-dimensional semiconductor material. For example, the first two-dimensional material layer 521' may include a transition metal dichalcogenide (TMD). The TMD may include, for example, one metal element selected from the group consisting of Mo, W, Nb, V, Ta, Ti, Zr, Hf, Tc, Re, Cu, Ga, In, Sn, Ge, and Pb, and one chalcogen element selected from the group consisting of S, Se, and Te. As an example, the first two-dimensional material layer may include $MoS_2$, $WS_2$, $MoSe_2$, or $WSe_2$ but is merely an example.

The deposition of the first two-dimensional material layer may be formed by, for example, chemical vapor deposition (CVD), physical vapor deposition (PVD), or the like. However, embodiments are not limited thereto. The first two-dimensional material layer may be formed to have the layer number of one layer. However, embodiments are not necessarily limited thereto.

Figure 6B:
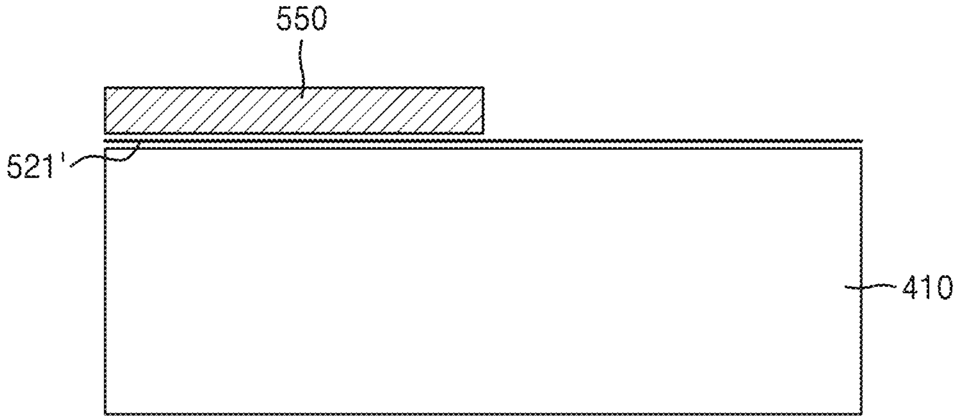

Referring to FIG. 6B, a mask 550 is formed on the first two-dimensional material layer 521'. The mask 550 may include, for example, a photoresist. In this case, the mask 550 may be formed by forming a photoresist on the first two-dimensional material layer 521' and then patterning the photoresist.

The mask 550 may include other mask materials in addition to the photoresist. In this case, the mask 550 may be formed by sequentially forming a mask material and a photoresist on the first two-dimensional material layer 521', patterning the photoresist, and etching the mask material using the patterned photoresist as an etching mask.

Figure 6C:
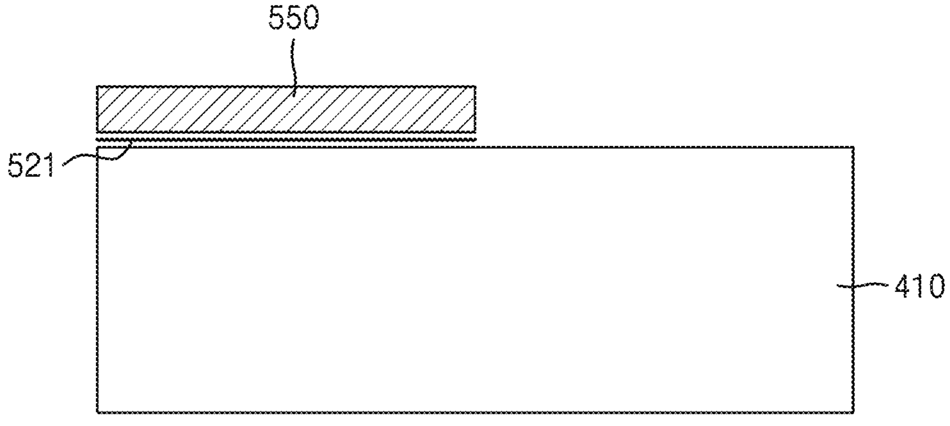

Referring to FIG. 6C, a portion of the first two-dimensional material layer 521 exposed through a mask is etched and removed. Accordingly, a patterned first two-dimensional material layer 521 exposing the substrate is formed.

Here, the etching process of the first two-dimensional material layer 521 may include sputtering etching. However, etching of the first two-dimensional material layer is not limited thereto, and may be performed through various other etching methods.

Figure 6D:
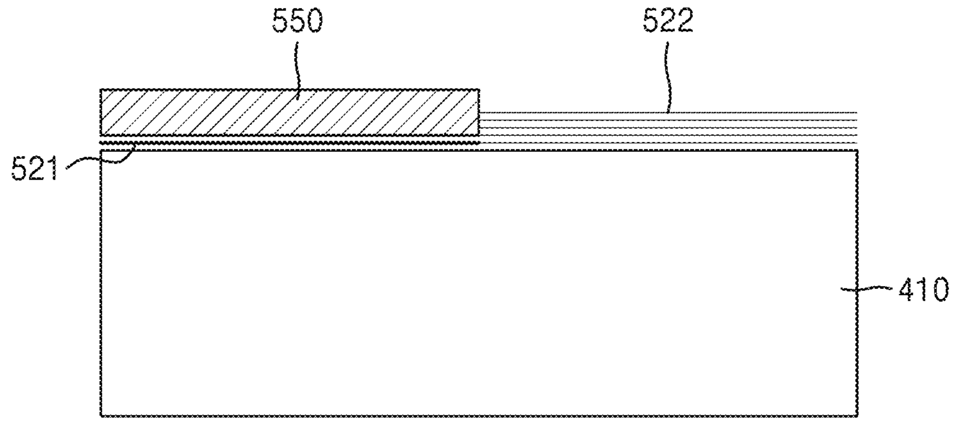

Referring to FIG. 6D, a second two-dimensional material layers 522 is formed on the surface of the substrate exposed by the etching of the first two-dimensional material layer 521. The second two-dimensional material layer 522 may be formed by depositing a second doped two-dimensional semiconductor material on the substrate. The second doped two-dimensional semiconductor material refers to a two-dimensional semiconductor material doped with a dopant having an opposite polarity to that of the first doped two-dimensional semiconductor material. For example, the first doped two-dimensional semiconductor material may include an n-type dopant, and the second doped two-dimensional semiconductor material may include a p-type dopant. For another example, the first doped two-dimensional semiconductor material may include a p-type dopant, and the second doped two-dimensional semiconductor material may include an n-type dopant. The two-dimensional semiconductor material may include, for example, a TMD.

The deposition of the second two-dimensional material layers 522 may be carried out through, for example, physical vapor deposition (PVD) such as sputtering deposition, chemical vapor deposition (CVD), or the like. Accordingly, the second two-dimensional material layers 522 may be bonded to the first two-dimensional material layer by lateral homojunction. Meanwhile, the sputtering process may grow a two-dimensional semiconductor material at a relatively low temperature compared to chemical vapor deposition. Therefore, when the above-described mask includes a photoresist requiring a low temperature process, the second two-dimensional material layer may be formed through sputtering deposition.

The second two-dimensional material layers 522 may have a thickness greater than that of the first two-dimensional material layer 521. That is, the second two-dimensional material layers 522 may have the layer number of two or more layers. For example, the second two-dimensional material layers 522 may be formed to have the layer number of 3 or more layers and 10 or less layers. However, embodiments are not limited thereto.

Figure 6E:
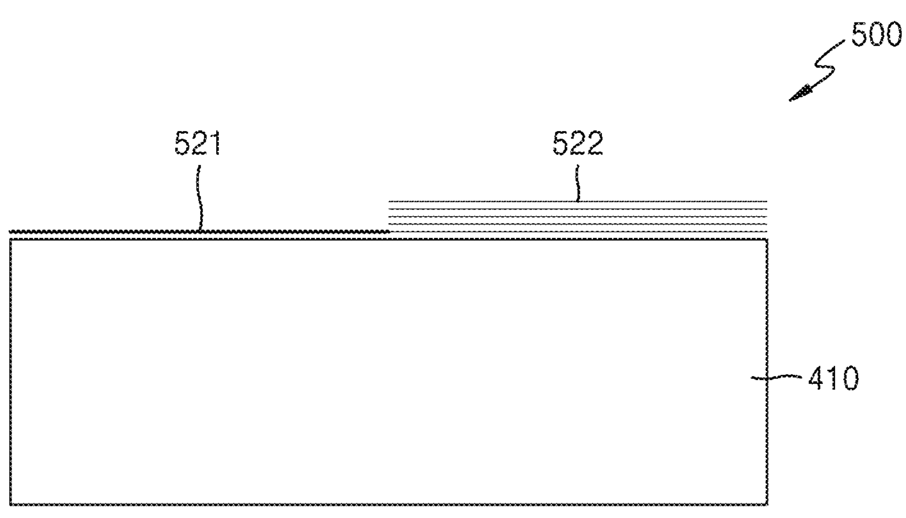

Referring to FIG. 6E, the mask 550 remaining in the first two-dimensional material layer 521 is removed. The mask 550 may be removed through an etching or lift-off process, but is not limited thereto. Accordingly, a semiconductor device having a structure in which a first two-dimensional material layer 521 including a first doped semiconductor material and a second two-dimensional material layer 522 including a second doped semiconductor material are bonded to each other on the substrate 410, specifically, a P-N junction diode, may be manufactured.

Hereinafter, a method of manufacturing a semiconductor device including a process of depositing a second two-dimensional material layer without etching a part of a first two-dimensional material layer will be described. FIGS. 7A to 7E are views for explaining a method of manufacturing a semiconductor device according to another example embodiment.

Figure 7A:
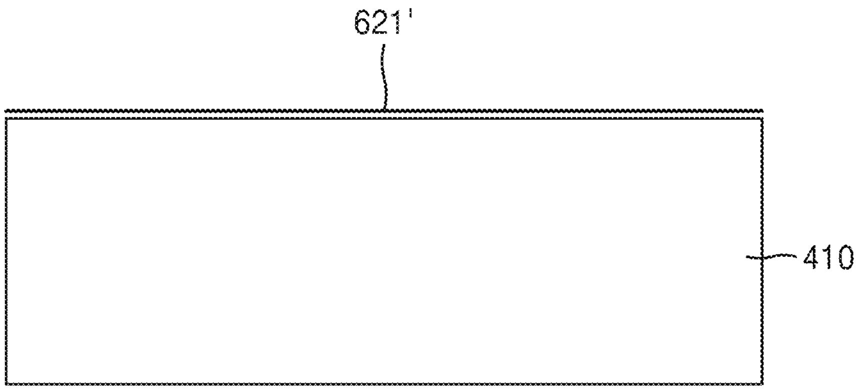
FIGS. 7A to 7E are views for explaining a method of manufacturing a semiconductor device according to another example embodiment.

Referring to FIG. 7A, a first two-dimensional material layer 621' is formed on a substrate 410. The first two-dimensional material layer 621' may be formed by depositing a first doped two-dimensional semiconductor material on the substrate 410. The first doped two-dimensional semiconductor material refers to a two-dimensional semiconductor material doped with a dopant having a desired and/or alternatively predetermined polarity, for example, an n-type dopant or a p-type dopant. The two-dimensional semiconductor material may include a TMD. The deposition of the first two-dimensional material layer may be formed by, for example, chemical vapor deposition (CVD), physical vapor deposition (PVD), or the like. The first two-dimensional material layer may be formed to have the layer number of one layer. However, embodiments are not necessarily limited thereto.

Figure 7B:
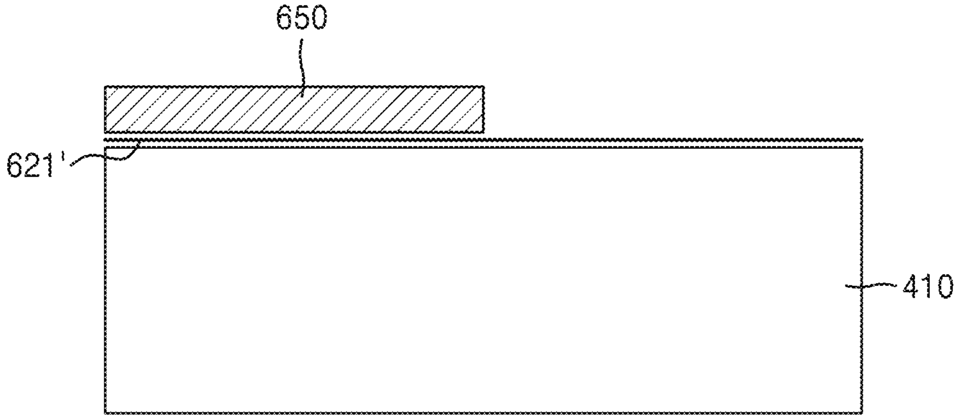

Referring to FIG. 7B, a mask 650 is formed on the first two-dimensional material layer 621'. The mask 650 may include, for example, a photoresist or other mask material.

Figure 7C:
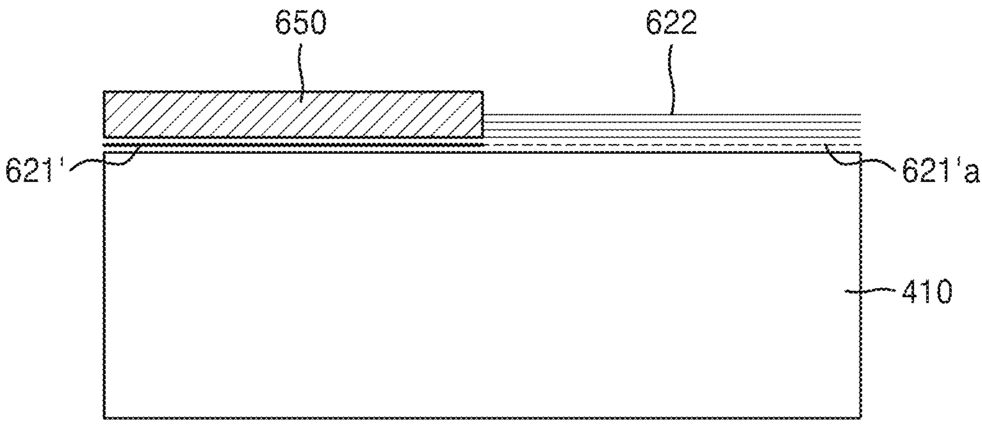

Referring to FIG. 7C, second two-dimensional material layers 622 are deposited on the first two-dimensional material layer 621' exposed through the mask 650. Accordingly, the second two-dimensional material layers 622 connected to the first two-dimensional material layer 621' may be formed on the substrate.

The second two-dimensional material layers 622 may be formed by depositing a second doped two-dimensional semiconductor material on the substrate. The second doped two-dimensional semiconductor material refers to a two-dimensional semiconductor material doped with a dopant having an opposite polarity to that of the first doped two-dimensional semiconductor material. For example, the first doped two-dimensional semiconductor material may include an n-type dopant, and the second doped two-dimensional semiconductor material may include a p-type dopant. For another example, the first doped two-dimensional semiconductor material may include a p-type dopant, and the second doped two-dimensional semiconductor material may include an n-type dopant.

The deposition of the second two-dimensional material layers 622 may be carried out through, for example, physical vapor deposition (PVD) such as sputtering deposition, chemical vapor deposition (CVD), or the like. Accordingly, the second two-dimensional material layers 622 may be bonded to the first two-dimensional material layer 621' by lateral homojunction. Meanwhile, the sputtering process may grow a two-dimensional semiconductor material at a relatively low temperature compared to chemical vapor deposition. Therefore, when the above-described mask includes a photoresist requiring a low temperature process, the second two-dimensional material layers 622 may be formed through sputtering deposition.

The second two-dimensional material layers 622 may have a thickness greater than that of the first two-dimensional material layer 621'. That is, the second two-dimensional material layers 622 may be formed to have the layer number of two or more layers. For example, the second two-dimensional material layers 622 may be formed to have the layer number of 3 or more layers and 10 or less layers. However, embodiments are not limited thereto.

In the process of depositing the second two-dimensional material layers 622, the first two-dimensional material layer 621' under the second two-dimensional material layers 622 may be damaged. For example, in the process of depositing the second two-dimensional material layers 622 through sputtering deposition, A damaged region 621'*a* may be generated in the first two-dimensional material layer 621' under the second two-dimensional material layers 622. However, it is merely an example and a damage region may be generated even through other deposition processes. The damage region 621'*a* of the first two-dimensional material layer may cause quality degradation with respect to at least one of the plurality of second two-dimensional material layers deposited through a subsequent additional process.

Figure 7D:
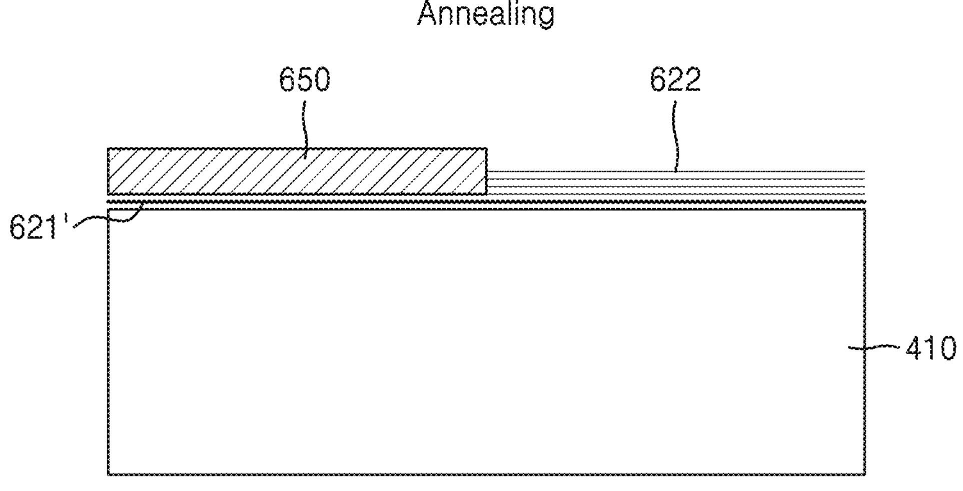

Referring to FIG. 7D, an annealing process is performed in the structure shown in FIG. 7C. Here, the annealing process may serve to treat the damaged region 621'*a* of the first two-dimensional material layer described above by heat-treating the damaged region 621'*a* at a desired and/or alternatively predetermined temperature. This annealing process may be performed, for example, at a temperature of about 300° C. or more and 900° C. or less. However, embodiments are not limited thereto.

Figure 7E:
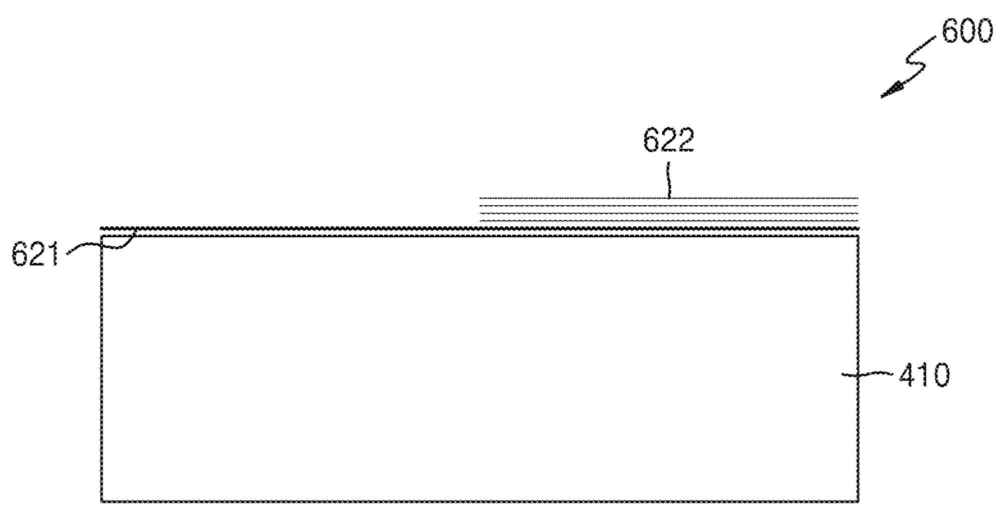

Referring to FIG. 7E, the mask 650 remaining in the first two-dimensional material layer 621 is removed. Accordingly, a semiconductor device having a structure in which a first two-dimensional material layer 621 including a first doped semiconductor material and a second two-dimensional material layer 622 including a second doped semiconductor material are bonded to each other on the substrate 410 may be manufactured.

The semiconductor device including a two-dimensional semiconductor material according to the above-described example embodiments includes a two-dimensional semiconductor material doped with a two-dimensional material layer in contact with an electrode, and is formed to have a thick thickness. Therefore, contact resistance between the two-dimensional material layer and the electrode formed thereon may be reduced.

Semiconductor devices according to example embodiments may be applied to circuit elements and electronic devices, but example embodiments are not limited thereto.

Figure 8:
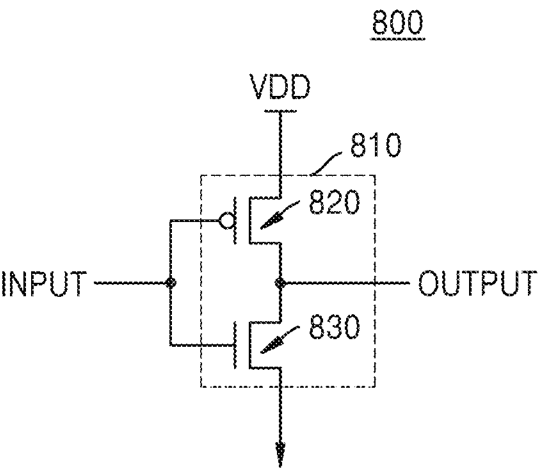
FIG. 8 is a circuit diagram of an inverter including a semiconductor device according to an example embodiment.

FIG. 8 is a circuit diagram of an inverter including a semiconductor device according to an example embodiment.

The inverter 800 includes a circuit element 810 including a p-type transistor 820 and an n-type transistor 830 disposed between a power terminal Vdd and a ground terminal. The transistors 820 and 830 each may include one of the semiconductor devices 100, 200, 300 according to example embodiments in FIGS. 1, 2F, and 3F.

Figure 9:
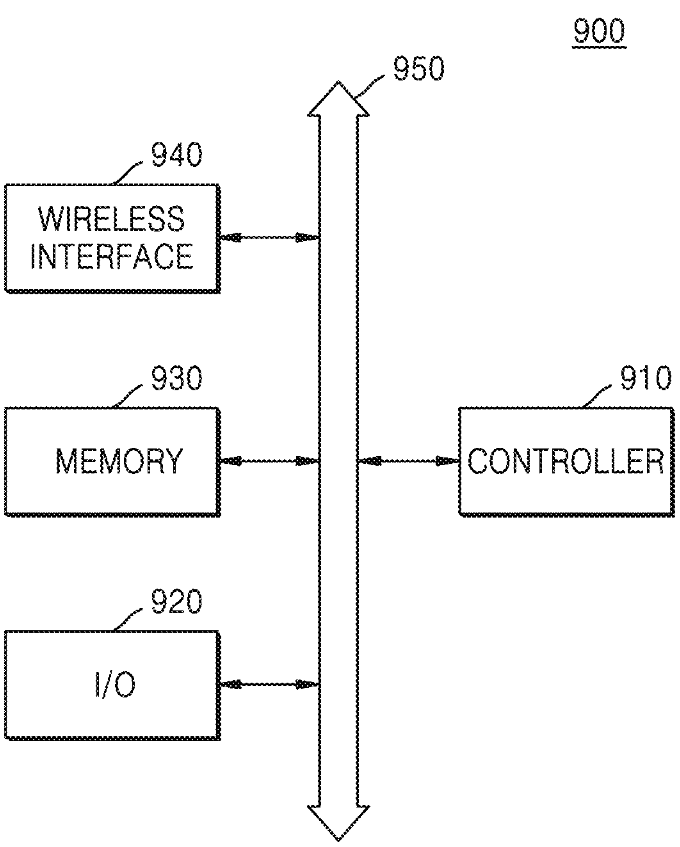
FIG. 9 is a block diagram of an electronic device including a semiconductor device according to an example embodiment.

FIG. 9 is a block diagram of an electronic device including a semiconductor device according to an example embodiment.

The electronic device 900 may provide a wireless communication apparatus or an apparatus capable of transmitting and/or receiving information under a wireless environment. The electronic device 900 includes a controller 910, an input/output device (I/O) 920, a memory 930, and a wireless interface 940, which are interconnected to each other via a bus 950.

The controller 910 may include at least one of a microprocessor, a digital signal processor, or a processing device similar thereto. The I/O device 920 may include at least one of a keypad, a keyboard, and a display. The memory 930 may be used to store instructions executed by controller 910. For example, the memory 930 may be used to store user data. The electronic device 900 may use the wireless interface 940 to transmit/receive data via a wireless communication network. The wireless interface 940 may include an antenna and/or a wireless transceiver. In some embodiments, the electronic device 900 may be used in a communication interface protocol of a communication system, such as a code division multiple access (CDMA), a global system for mobile communications (GSM), a north American digital cellular (NADC), an extended-time division multiple access (E-TDMA), and/or a wide band code division multiple access (WCDMA), a fourth generation communication system such as 4G LTE, a fifth generation communication system and the like).

The memory 930 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The controller 910 may execute the stored program of instructions to perform one or more functions. For example, the controller 910 may be configured to process electrical signals generated by a sensor such as a photodetector (not shown) connected to controller 910. The controller 910 may be configured to generate an output (e.g., signal corresponding to detected light intensity) based on such as processing. The electronic device 900 may include one or more of the semiconductor devices 100, 200, 300, 400, 500, and 600 according to example embodiments in FIGS. 1, 2F, 3F, 5, 6E, and 7E.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although the presented embodiments have been described above, these are merely non-limiting examples, and various modifications may be made thereto by those of ordinary skill in the art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:

a first two-dimensional material layer including a two-dimensional semiconductor material;

a plurality of second two-dimensional material layers connected to the first two-dimensional material layer, each of the plurality of second two-dimensional material layers having a thickness greater than a thickness of the first two-dimensional material layer, and each of the plurality of second two-dimensional material layers including a doped two-dimensional semiconductor material; and a plurality of electrodes on the plurality of second two-dimensional material layers.

2. The semiconductor device of claim 1, wherein each of the first two-dimensional material layer and the plurality of second two-dimensional material layers include a transition metal dichalcogenide (TMD).

3. The semiconductor device of claim 2, wherein the TMD comprises at least one of Mo, W, Nb, V, Ta, Ti, Zr, Hf, Tc, Re, Cu, Ga, In, Sn, Ge, and Pb, and the TMD comprises at least one of S, Se, and Te.

4. The semiconductor device of claim 1, wherein the first two-dimensional material layer comprises one to three layers.

5. The semiconductor device of claim 1, wherein the plurality of second two-dimensional material layers each comprise four layers or more.

6. The semiconductor device of claim 1, wherein the plurality of second two-dimensional material layers each comprise four to ten layers.

7. The semiconductor device of claim 1, wherein the plurality of second two-dimensional material layers comprise a transition metal as a dopant.

8. The semiconductor device of claim 1, wherein the first two-dimensional material layer is between two adjacent second two-dimensional material layers among the plurality of second two-dimensional material layers.

9. The semiconductor device of claim 1, wherein the first two-dimensional material layer comprises an n-type dopant or a p-type dopant.

10. The semiconductor device of claim 1, wherein the two-dimensional semiconductor material in the first two-dimensional material layer is a same material in an entire portion of the first two-dimensional material layer, each of the plurality of second two-dimensional material layers are the doped two-dimensional semiconductor material, and each of the two-dimensional semiconductor material and the doped two-dimensional semiconductor material are a transition metal dichalcogenide (TMD).

11. The semiconductor device of claim 1, wherein the two-dimensional semiconductor material of the first two-dimensional material layer is undoped.

* * * * *